(12) United States Patent
Kim et al.

(10) Patent No.: US 7,591,963 B2
(45) Date of Patent: Sep. 22, 2009

(54) WHITE LIGHT EMITTING DEVICE

(75) Inventors: Shi-surk Kim, Incheon (KR);
Duk-young Jeon, Daejeon (KR);
Ho-seong Jang, Incheon (KR)

(73) Assignee: CMS Technology Inc., Asan (KR)

( * ) Notice: Subject to any disclaimer, the term of this patent is extended or adjusted under 35 U.S.C. 154(b) by 240 days.

(21) Appl. No.: 11/575,504

(22) PCT Filed: Apr. 12, 2005

(86) PCT No.: PCT/KR2005/001046

§ 371 (c)(1),
(2), (4) Date: Mar. 19, 2007

(87) PCT Pub. No.: WO2006/041249

PCT Pub. Date: Apr. 20, 2006

(65) Prior Publication Data

US 2008/0197320 A1     Aug. 21, 2008

(30) Foreign Application Priority Data

Oct. 11, 2004    (KR) ...................... 10-2004-0080982

(51) Int. Cl.
*H01L 33/00* (2006.01)
*C09K 11/80* (2006.01)

(52) U.S. Cl. .................. 252/301.4 R; 257/98; 313/503
(58) Field of Classification Search .......... 252/301.4 R, 252/301.4 F; 257/98; 313/503
See application file for complete search history.

(56) References Cited

U.S. PATENT DOCUMENTS

| 4,755,715 | A | 7/1988 | Berkstresser et al. |
|---|---|---|---|
| 6,596,195 | B2 * | 7/2003 | Srivastava et al. ..... 252/301.4 R |
| 6,669,866 | B1 * | 12/2003 | Kummer et al. ........ 252/301.4 R |
| 7,169,326 | B2 * | 1/2007 | Wu et al. .............. 252/301.4 F |
| 7,267,786 | B2 * | 9/2007 | Fiedler et al. ......... 252/301.4 F |

FOREIGN PATENT DOCUMENTS

| JP | 2003-535478 | 11/2003 |
|---|---|---|
| JP | 2004-115304 | 4/2004 |
| JP | 2004-250705 | 9/2004 |
| WO | WO 98/05078 | 2/1998 |
| WO | WO 98/39805 | 9/1998 |
| WO | WO 01/08452 * | 2/2001 |
| WO | WO 01/93342 A1 | 12/2001 |

OTHER PUBLICATIONS

Shuji Nakamura, "The Blue Laser Diode", Springer-Verlag, 1997, pp. 216-219.

* cited by examiner

*Primary Examiner*—C. Melissa Koslow
(74) *Attorney, Agent, or Firm*—Oblon, Spivak, McClelland, Maier & Neustadt, L.L.P.

(57) ABSTRACT

The present invention relates to a phosphor having excellent emission brightness by inclusion of Si or Fe in the phosphor having a TbAG:Ce composition, and a white LED. The white photoluminescent device in accordance with the present invention comprises at least one light-emitting diode emitting light with a wavelength of 430 to 470 nm and a phosphor having a composition of TbAG:Ce, wherein the phosphor having a composition of TbAG:Ce is composed of a compositional formula of $(Tb_{1-x}Ce_x)_3(Al_{1-y}M_y)_5O_{12}$, wherein x is between 0.01 and 0.4, y is between 0.0 and 0.1, and M is selected from the group consisting of Si and Fe.

8 Claims, 5 Drawing Sheets

WHITE LIGHT EMITTING DEVICE

BACKGROUND OF THE INVENTION

1. Field of the Invention

The present invention relates to a TAG phosphor and a White Light Emitting Diode (White LED) using the same. More specifically, the present invention relates to a phosphor having excellent emission brightness by inclusion of Si or Fe in the phosphor having a TbAG:Ce composition, and a white LED utilizing the same.

2. Description of the Related Art

The white LED is a next generation light emitting device potential capable of replacing conventionally used general lighting means. The white LED has advantages such as very low power consumption compared to conventional light sources, high photoluminescence efficiency and high brightness, long-term service life and rapid response time.

Methods of manufacturing white LEDs may be broadly divided into the following 3 types: the first method is to use a combination of high-brightness red, green and blue LEDs, the second method is to coat red, green and blue light-emitting phosphors on a UV LED and finally, and the third method is to coat a blue LED with light-emitting phosphors.

The first method using a combination of red, green and blue LEDs suffers from problems in that three diodes should be used in the form of one chip, thus resulting in an increase in volume.

The second method involving coating red, green and blue light-emitting phosphors on the UV LED is disclosed in WO9839805. This method is the most ideal method of producing three-wavelength white light by transmission of UV light into three primary color phosphors. However, phosphors having good photoluminescence efficiency of UV light have yet to be developed.

The last method of manufacturing the white LED by coating light-emitting phosphors on the blue LED is currently undergoing the most wide and extensive study. This method has advantages in that it is possible to achieve easy production due to the simplified structure of the white LED and it is also possible to obtain high-brightness white light. Such a method is disclosed in detail in WO9805078, filed by Nichia, a Japanese company. This method is also detailed in S. Nakamura, "The Blue Laser Diode", Springer-Verlag, P. 216-219, 1997. According to this method, white light is produced by the combination of blue and yellow light such that the blue light emitted from the LED is absorbed by yttrium-aluminum garnet ($Y_2Al_5O_{12}:Ce^{3+}$; YAG) phosphor which then emits yellow light. However, YAG-based light-emitting phosphors, due to unique properties of their light-emitting wavelengths, exhibit relatively weak photoluminescence intensity in a red light region, thereby making it difficult to obtain superior color rendering characteristics, and are susceptible to color temperature. Therefore, YAG-based light-emitting phosphors are disadvantageously not suitable for use in environmental illumination or as an LCD color backlight source.

SUMMARY OF THE INVENTION

Therefore, the present invention has been made in view of the above problems, and it is an object of the present invention to provide a TAG phosphor having high photoluminescence intensity in a red light region, good color rendering properties, and high-brightness pure light emitting characteristics, and a white light emitting diode (white LED) utilizing the same.

In accordance with the present invention, the above and other objects can be accomplished by the provision of a phosphor having a composition of TbAG:Ce, wherein the phosphor having a composition of TbAG:Ce is composed of a compositional formula of $(Tb_{1-x}Ce_x)_3(Al_{1-y}M_y)_5O_{12}$, wherein x is between 0.01 and 0.4, y is between 0.0 and 0.1, and M is selected from the group consisting of Si and Fe.

In the above formula, if M is Si, y is preferably between 0.01 and 0.04, whereas if M is Fe, y is preferably between 0.01 and 0.02.

In addition, the white photoluminescent device in accordance with the present invention comprises at least one light-emitting diode emitting light with a wavelength of 430 to 470 nm and a phosphor having a composition of TbAG:Ce, wherein the phosphor having a composition of TbAG:Ce is composed of a compositional formula of $(Tb_{1-x}Ce_x)_3(Al_{1-y}M_y)_5O_{12}$, wherein x is between 0.01 and 0.4, y is between 0.0 and 0.1, and M is selected from the group consisting of Si and Fe.

In the formula, if M is Si, y is preferably between 0.01 and 0.04, whereas if M is Fe, y is preferably between 0.01 and 0.02.

The phosphor in accordance with the present invention is primarily made of Tb and Al as a mother body, and $Ce^{3+}$ functions as an activator. Where the amount of cerium is less than 0.01, it is not sufficient to serve as the activator. In contrast, where the amount of cerium is greater than 0.4, this may undesirably cause lowering in brightness due to concentration quenching effects.

As raw materials for the phosphor in accordance with the present invention, mention may be made of $Tb_4O_7$, $Al_2O_3$ and $CeO_2$, for example. As an additive, $SiO_2$ or $Fe_2O_3$ may be utilized. These materials are quantified within an optimal molar ratio, and are sufficiently mixed to obtain a uniform composition using a mixer. The resulting mixture is placed in a crucible, which is covered with a lid. Then, the mixture is introduced into an electric furnace and calcined by heating the mixture at a temperature of 1400 to 1600° C. for 1 to 4 hours. If the calcination temperature is less than 1400° C., single-phase crystals are not completely formed and unreacted reactants or by-products are produced. In addition, if the calcination temperature is above 1600° C., irregularly shaped particles are formed, thus sharply lowering brightness.

Further, fluoride flux may be added to a calcination process. The quantity of fluoride used is preferably in the range of 7 to 15 wt %, relative to $(Tb_{1-x}Ce_x)_3(Al_{1-y}M_y)_3O_{12}$. More preferred is 8 wt %. The fluoride utilized in the present invention may include, for example, barium fluoride, ammonium fluoride, sodium fluoride and alumina fluoride. Use of such fluorides in the calcination process enables easy attainment of single-phase phosphors and makes it possible to obtain high-brightness superior phosphors even at low synthesis temperatures.

After completion of the calcination process, the calcined materials are cooled to room temperature and milled in vacuo or under water using a ball mill to obtain powdered phosphors having a diameter of 0.5 to 20 μm size. The thus-obtained phosphors having a stable phase of $(Tb_{1-x}Ce_x)_3(Al_{1-y}Si_y)_3O_{12}$ or $(Tb_{1-x}Ce_x)_3(Al_{1-y}Fe_y)_3O_{12}$ are coated on a blue light-emitting diode chip with an emission wavelength near 460 nm made up of GaN or the like. Preferably, 1 to 40 wt % of phosphors are mixed with epoxy resins or silicon based resins and the resulting mixture is coated on the blue LED chip which is then cured at a temperature of 130 to 200° C. to fabricate a white light-emitting diode.

As such, it is possible to obtain a white light source that achieves high quantum efficiency, desired color temperature (4500 K to 8000 K) and good color rendering characteristics by use of the single phosphor material in accordance with the present invention alone, and is suited to mass production.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

The following is a comparative analysis of properties of the TAG phosphor and white light-emitting diode prepared according to various examples of the present invention

EXAMPLES

Now, the present invention will be described in more detail with reference to the following Examples. These examples are provided only for illustrating the present invention and should not be construed as limiting the scope and spirit of the present invention.

Example 1

Comparative analysis between the TAG phosphor prepared according to the present invention and a conventional phosphor is given as follows.

Figure 1:
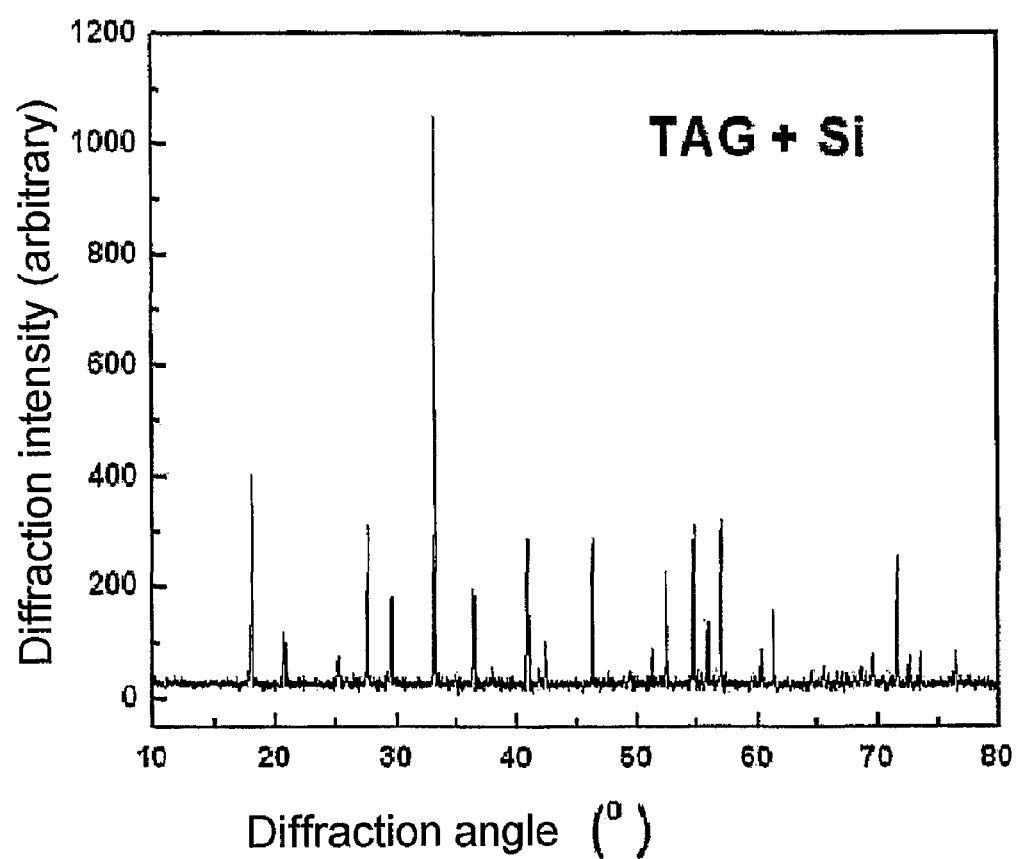
FIG. 1 is an XRD result of a TAG phosphor in accordance with the present invention.

FIG. 1 shows the results of X-ray diffraction (XRD) of $(Tb_{0.9}Ce_{0.1})_3(Al_{1-y}Si_y)_5O_{12}$ phosphors prepared in accordance with the present invention. As can be seen from FIG. 1, the TAG phosphors prepared in accordance with the process of the present invention show formation of a stable garnet structure (TAG).

Figure 2:
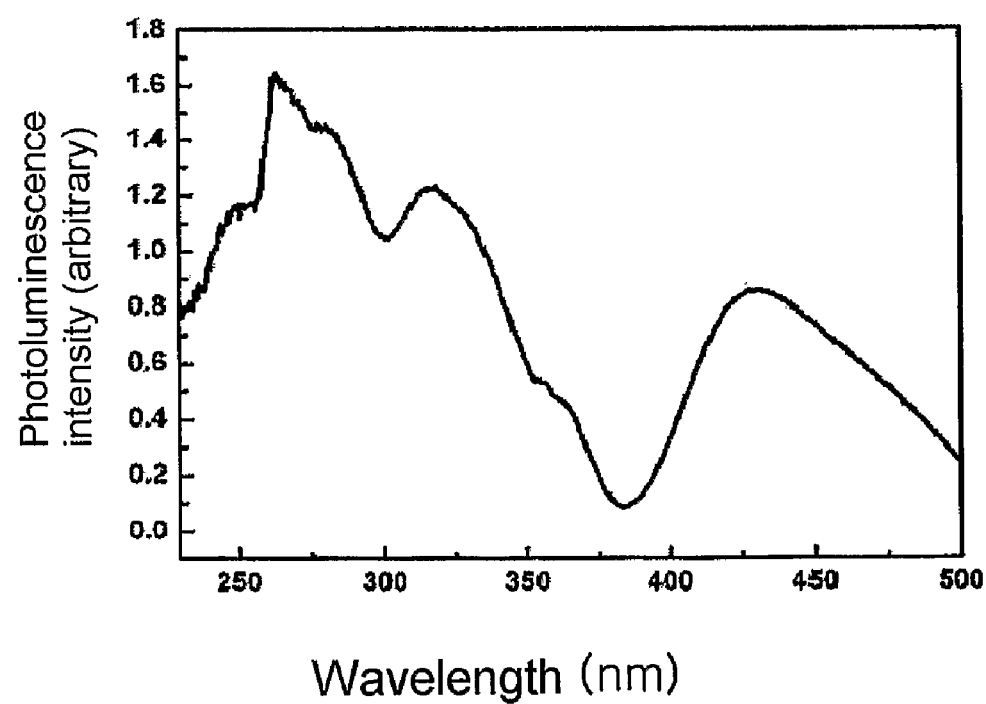
FIG. 2 is an excitation spectrum of a TAG phosphor in accordance with the present invention.
Figure 3:
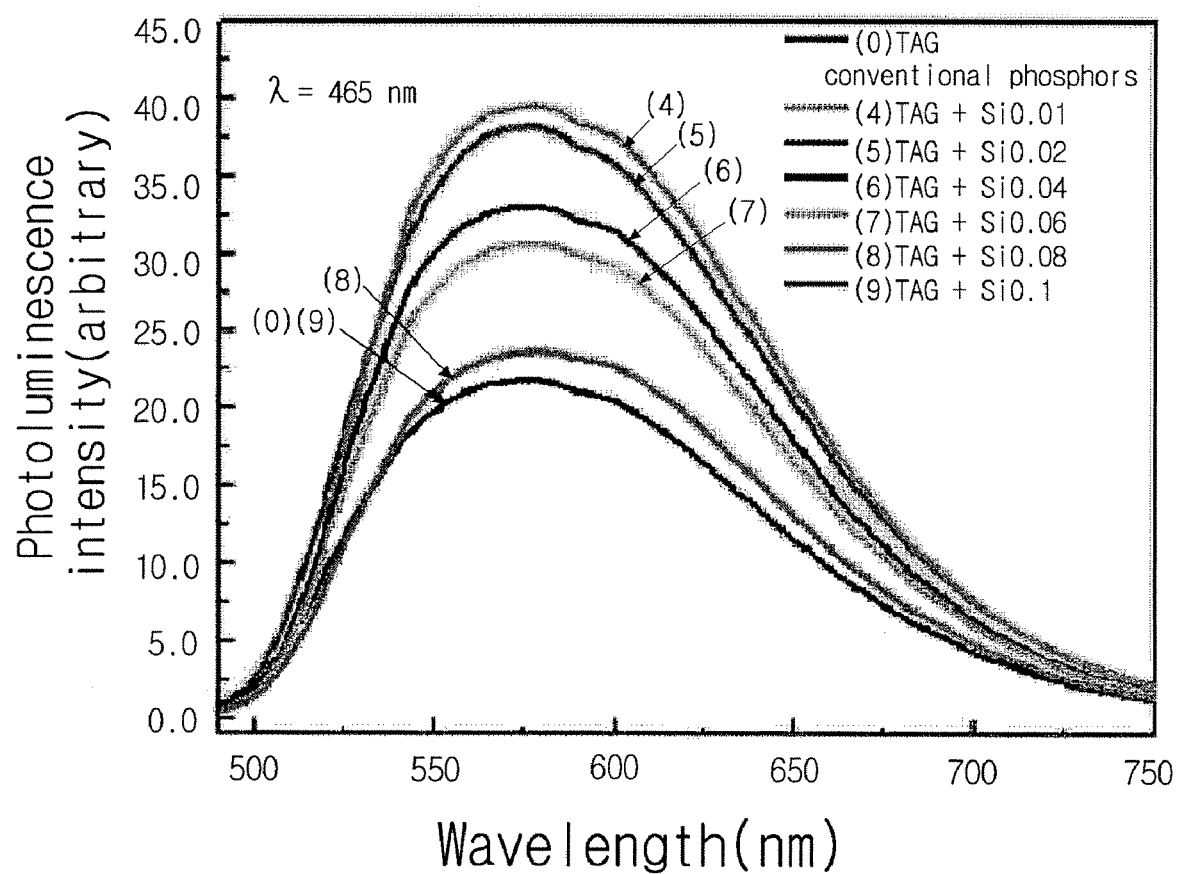
FIG. 3 is a photoluminescence spectrum of a TAG phosphor in accordance with the present invention.

FIG. 2 shows an excitation spectrum of $(Tb_{0.9}Ce_{0.1})_3(Al_{1-y}Si_y)_5O_{12}$ phosphors prepared according to the present invention. FIG. 3 shows comparison between photoluminescence spectra measured under an excitation wavelength of 465 nm, with respect to Si concentrations in $(Tb_{0.9}Ce_{0.1})_3(Al_{1-y}Si_y)_5O_{12}$ phosphors. As can be seen from FIG. 3, the red-band photoluminescence intensity is stronger in phosphors containing Si, as in the present invention, than in conventional $Tb_3Al_5O_{12}$:Ce phosphors.

Table 1 summarizes photoluminescence intensity of $Tb_3Al_5O_{12}$:$Ce_{0.1}$ (sample #0) phosphors prepared according to a conventional method and the $(Tb_{0.9}Ce_{0.1})_3(Al_{1-y}Si_y)_5O_{12}$ phosphors prepared according to the present invention measured under an excitation wavelength of 465 nm, based on the molar ratio of Si.

TABLE 1

| Sample # | Tb | Ce | Al | Si | PL Intensity (arbitrary) | PL increase (%) | Remarks |
|---|---|---|---|---|---|---|---|
| 0 | 0.9 | 0.1 | 1.0 | 0.000 | 22.5 | — | Comp. Ex. |
| 1 | 0.9 | 0.1 | 0.9975 | 0.0025 | 22.6 | — | |
| 2 | 0.9 | 0.1 | 0.9950 | 0.0050 | 23.8 | — | |
| 3 | 0.9 | 0.1 | 0.9925 | 0.0075 | 29.0 | 28.9 | |
| 4 | 0.9 | 0.1 | 0.99 | 0.01 | 42.0 | 86.7 | |
| 5 | 0.9 | 0.1 | 0.98 | 0.02 | 40.0 | 77.8 | |
| 6 | 0.9 | 0.1 | 0.96 | 0.04 | 35.0 | 55.6 | |
| 7 | 0.9 | 0.1 | 0.94 | 0.06 | 31.0 | 37.7 | |
| 8 | 0.9 | 0.1 | 0.92 | 0.08 | 27.5 | 22.2 | |
| 9 | 0.9 | 0.1 | 0.90 | 0.1 | 23.8 | 5.8 | |

Photoluminescence intensity (PL) was remarkably excellent in the range of 0.01 to 0.04 of the Si molar ratio. In particular, when the Si molar ratio was 0.01, it showed about 87% improvement in PL, as compared to a comparative example.

Table 2 summarizes photoluminescence intensity of $Tb_3Al_5O_{12}:Ce_{0.1}$ (sample #0) phosphors prepared according to a conventional method and the $(Tb_{0.9}Ce_{0.1})_3(Al_{1-y}Fe_y)_5O_{12}$ phosphors prepared according to the present invention measured under an excitation wavelength of 465 nm, based on the molar ratio of Fe.

TABLE 2

| Sample # | Tb | Ce | Al | Fe | PL Intensity (arbitrary) | PL increase (%) | Remarks |
|---|---|---|---|---|---|---|---|
| 0 | 0.9 | 0.1 | 1.0 | 0.000 | 22.5 | — | Comp. Ex. |
| 10 | 0.9 | 0.1 | 0.9975 | 0.0025 | 22.6 | — | |
| 11 | 0.9 | 0.1 | 0.9950 | 0.0050 | 23.8 | — | |
| 12 | 0.9 | 0.1 | 0.9925 | 0.0075 | 26.2 | 16.4 | |
| 13 | 0.9 | 0.1 | 0.99 | 0.01 | 34.0 | 51.1 | |
| 14 | 0.9 | 0.1 | 0.98 | 0.02 | 32.0 | 42.2 | |
| 15 | 0.9 | 0.1 | 0.96 | 0.04 | 29.5 | 31.1 | |
| 16 | 0.9 | 0.1 | 0.94 | 0.06 | 27.0 | 30.0 | |
| 17 | 0.9 | 0.1 | 0.92 | 0.08 | 25.5 | 13.3 | |
| 18 | 0.9 | 0.1 | 0.90 | 0.1 | 22.6 | — | |

As can be seen from table 2, photoluminescence intensity was remarkably excellent in the range of 0.01 to 0.02 of the Fe molar ratio. When the Fe molar ratio was 0.01, it showed about 51% improvement in photoluminescence intensity, as compared to a comparative example. Fe has lower excitation intensity than Si, but the phosphors having a Fe molar ratio of 0.01 mol exhibited better results than the comparative example.

Example 2

The following evaluation results illustrate properties of a white LED prepared by applying a mixture of the TAG phosphor prepared according to the present invention and a light-transmissive silicon resin to a 460 nm (In)GaN blue light-emitting diode chip, followed by curing and drying.

Table 3 summarizes characteristics of $Tb_3Al_5O_{12}:Ce_{0.1}$ (sample #0) phosphors prepared according to a conventional method and the $(Tb_{0.9}Ce_{0.1})_3(Al_{1-y}Si_y)_5O_{12}$ phosphors with replacement of Si content with the range of $0.0<y<0.1$, prepared according to the present invention, on the basis of the molar ratio.

Reliability data is a proportion of sample with characteristics equal to or higher than given criteria, after heat treatment at 85° C. for 500 hours. At a Si molar ratio of 0.01 to 0.04, remarkably excellent results were obtained, as compared to the conventional art. In particular, when the Si molar ratio was 0.01, brightness increased by 47% and reliability was improved to 97.7%.

Figure 4:
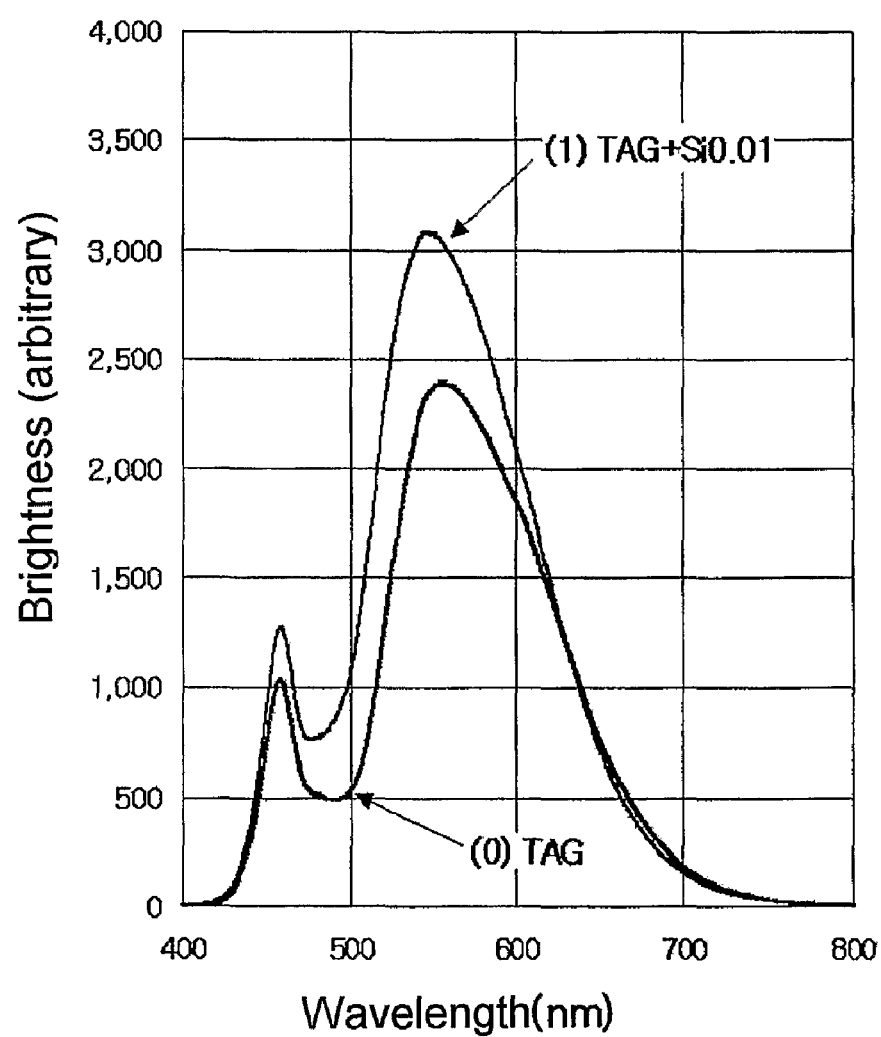
FIG. 4 is a photoluminescence spectrum result of a TAG phosphor based light-emitting diode in accordance with the present invention.

FIG. 4 is a photoluminescence spectrum result of a light-emitting diode fabricated using $(Tb_{0.9}Ce_{0.1})_3(Al_{0.99}Si_{0.01})_5O_{12}$ phosphors prepared according to the present invention.

Table 4 summarizes characteristics of $Tb_3Al_5O_{12}:Ce_{0.1}$ (sample #0) phosphors prepared according to a conventional method and the $(Tb_{0.9}Ce_{0.1})_3(Al_{1-y}Fe_y)_5O_{12}$ with replacement of Fe content with the range of $0.0<y<0.1$, prepared according to the present invention, on the basis of molar ratio.

TABLE 3

| Sample # | Tb | Ce | Al | Si | Brightness (lm) | Brightness increase (%) | Reliability (%) |
|---|---|---|---|---|---|---|---|
| 0 | 0.9 | 0.1 | 1.0 | 0.000 | 1.64 | — | 92.80 |
| 19 | 0.9 | 0.1 | 0.9975 | 0.0025 | 1.73 | — | — |
| 20 | 0.9 | 0.1 | 0.9950 | 0.0050 | 1.73 | — | — |
| 21 | 0.9 | 0.1 | 0.9925 | 0.0075 | 1.92 | 17.1 | 93.90 |
| 22 | 0.9 | 0.1 | 0.99 | 0.01 | 2.41 | 47.0 | 97.70 |
| 23 | 0.9 | 0.1 | 0.98 | 0.02 | 2.35 | 43.3 | 95.24 |
| 24 | 0.9 | 0.1 | 0.96 | 0.04 | 2.19 | 33.5 | 94.56 |
| 25 | 0.9 | 0.1 | 0.94 | 0.06 | 1.98 | 20.7 | 94.60 |
| 26 | 0.9 | 0.1 | 0.92 | 0.08 | 1.85 | 12.8 | 93.81 |
| 27 | 0.9 | 0.1 | 0.90 | 0.1 | 1.70 | 3.7 | 93.00 |

TABLE 4

| Sample # | Tb | Ce | Al | Fe | Brightness (lm) | Brightness increase (%) | Reliability (%) |
|---|---|---|---|---|---|---|---|
| 0 | 0.9 | 0.1 | 1.0 | 0.000 | 1.64 | — | 92.80 |
| 28 | 0.9 | 0.1 | 0.9975 | 0.0025 | 1.73 | — | — |
| 29 | 0.9 | 0.1 | 0.9950 | 0.0050 | 1.89 | 15.2 | 94.50 |
| 30 | 0.9 | 0.1 | 0.9925 | 0.0075 | 1.95 | 18.9 | 93.85 |
| 31 | 0.9 | 0.1 | 0.99 | 0.01 | 2.17 | 32.3 | 95.20 |
| 32 | 0.9 | 0.1 | 0.98 | 0.02 | 1.97 | 20.7 | 94.84 |
| 33 | 0.9 | 0.1 | 0.96 | 0.04 | 1.80 | 9.8 | 94.60 |
| 34 | 0.9 | 0.1 | 0.94 | 0.06 | 1.78 | 8.5 | 93.28 |
| 35 | 0.9 | 0.1 | 0.92 | 0.08 | 1.70 | 3.7 | 93.11 |
| 36 | 0.9 | 0.1 | 0.90 | 0.1 | 1.64 | — | 92.90 |

Reliability data is a proportion of sample with characteristics equal to or higher than given criteria, after heat treatment at 85° C. for 500 hours. The Fe molar ratio of 0.01 to 0.02 exhibited remarkably excellent results, as compared to the conventional art. In particular, when the Fe molar ratio was 0.01, brightness increased by 37% and reliability was improved to 95.2%.

Figure 5:
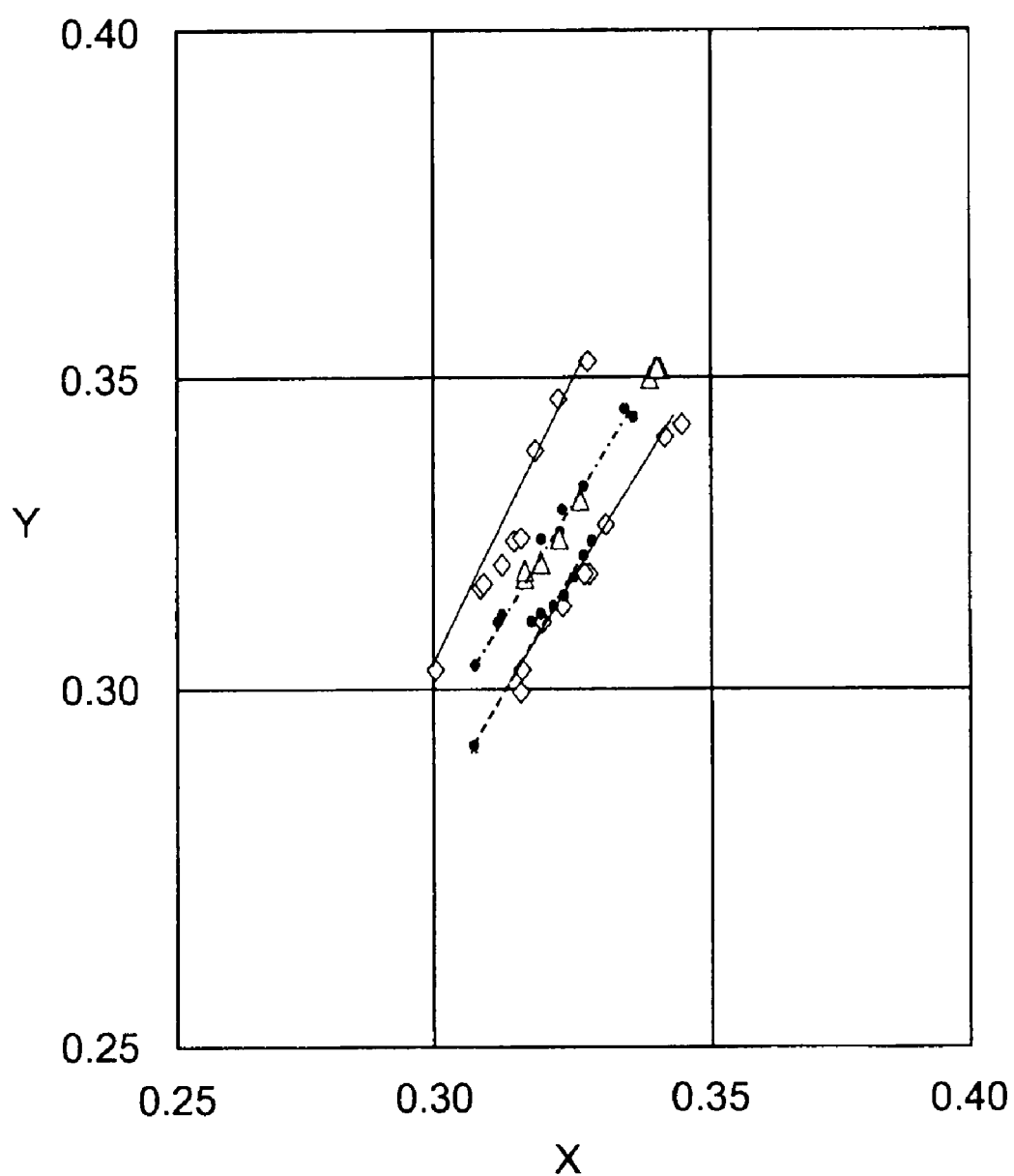
FIG. 5 is a color coordinate of a TAG phosphor based light-emitting diode in accordance with the present invention.

FIG. 5 shows the measured result of a CIE (Commission international de l'Eclairage) color coordinate (X, Y) on a photoluminescence spectrum of a light-emitting diode fabricated using a TAG phosphor in accordance with the present invention. As can be seen from FIG. 5, X and Y coordinates exhibited excellent color rendering within the range of pure white color, high brightness and excellent reliability. In FIG. 5, the lozenge and triangle symbols show the measured result of a color coordinate (X,Y) on a photoluminescence spectrum of a white LED fabricated using $(Tb_{0.9}Ce_{0.1})_3(Al_{1-y}Si_y)_5O_{12}$ phosphors according to the invention, and the dot symbol shows the measured result of a color coordinate (X, Y) on a photoluminescence spectrum of a white LED fabricated using $(Tb_{0.9}Ce_{0.1})_3(Al_{1-y}Si_y)_5O_{12}$ phosphors according to the invention.

The white LED fabricated using $(Tb_{0.9}Ce_{0.1})_3(Al_{0.95}Si_{0.05})_5O_{12}$ phosphors had a chromaticity point XY= (0.298,0.32), and photoluminescence efficiency of 1.77 ml/w. In addition, the white LED fabricated using $(Tb_{0.95}Ce_{0.05})_3(Al_{0.9}Fe_{0.1})_5O_{12}$ phosphors had a chromaticity point XY= (0.31,0.29), and photoluminescence efficiency of 1.779 ml/w.

As apparent from the above description, in accordance with the present invention, it is possible to obtain a white LED having high brightness and excellent color rendering characteristics. Further, it is possible to obtain a TAG based white LED having strong photoluminescence intensity in a red light region and excellent chip color characteristics.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A phosphor having a composition of TbAG:Ce, wherein the phosphor having a composition of TbAG:Ce has a compositional formula of $(Tb_{1-x}Ce_x)_3(Al_{1-y}Fe_y)_5O_{12}$, where x is between 0.01 and 0.4, and y is between 0.01 and 0.02.

2. The phosphor having a composition of TbAG:Ce according to claim 1, wherein the phosphor having a composition of TbAG:Ce is a powder comprising particles each having a diameter in a range of from 0.5 to 20 μm.

3. A white photoluminescent device comprising at least one light-emitting diode emitting light with a wavelength of 430 to 470 nm and a phosphor having a composition of TbAG:Ce, wherein the phosphor having a composition of TbAG:Ce has a compositional formula of $(Tb_{1-x}Ce_x)_3(Al_{1-y}Fe_y)_5O_{12}$, where x is between 0.01 and 0.4, and y is between 0.01 and 0.02.

4. The white photoluminescent device according to claim 3, wherein the phosphor having a composition of TbAG:Ce is a powder comprising particles each having a diameter in a range of from 0.5 to 20 μm.

5. The white photoluminescent device according to claim 3, further comprising a resin, wherein the phosphor having a composition of TbAG:Ce is mixed with the resin.

6. The white photoluminescent device according to claim 5, wherein the resin is selected from the group consisting of epoxy resins and silicon based resins.

7. A method of making a phosphor, the method comprising
heating a mixture of raw materials at a temperature in a range of from 1400 to 1600° C.; and
producing the phosphor having a composition of TbAG:Ce of claim 1.

8. A method of making a white photoluminescent device, the method comprising
applying to a light-emitting diode a phosphor having a composition of TbAG:Ce, where the phosphor having a composition of TbAG:Ce has a compositional formula of $(Tb_{1-x}Ce_x)_3(Al_{1-y}Fe_y)_5O_{12}$, x is between 0.01 and 0.4, and y is between 0.01 and 0.02; and
producing the device of claim 3.

* * * * *